US012785629B2

(12) United States Patent
Gebeyehu

(10) Patent No.: US 12,785,629 B2
(45) Date of Patent: Nov. 3, 2026

(54) AMPLIFIER CIRCUIT WITH PROTECTION CIRCUIT

(71) Applicant: Skyworks Solutions, Inc., Irvine, CA (US)

(72) Inventor: Netsanet Gebeyehu, San Jose, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 579 days.

(21) Appl. No.: 18/123,818

(22) Filed: Mar. 20, 2023

(65) Prior Publication Data

US 2023/0327609 A1 Oct. 12, 2023

Related U.S. Application Data

(60) Provisional application No. 63/328,486, filed on Apr. 7, 2022.

(51) Int. Cl.
*H03F 1/30* (2006.01)
*H03F 3/24* (2006.01)

(52) U.S. Cl.
CPC ............... *H03F 1/30* (2013.01); *H03F 3/245* (2013.01); *H03F 2200/153* (2013.01); *H03F 2200/426* (2013.01); *H03F 2200/441* (2013.01); *H03F 2200/451* (2013.01)

(58) Field of Classification Search
CPC ................ H03F 1/30; H03F 3/20; H03G 3/30
USPC ......................................... 330/297, 296, 285
See application file for complete search history.

(56) References Cited

U.S. PATENT DOCUMENTS 7,443,246 B2 10/2008 Andrys et al.
8,497,737 B2 * 7/2013 Langer .................... H03F 3/189 330/296
8,587,380 B2 * 11/2013 Wang .................... H03F 1/0261 330/296
8,829,997 B1 * 9/2014 Morkner .............. H03G 3/3042 330/285
8,866,547 B2 * 10/2014 Mathe ........................ H03F 3/21 330/297
9,093,969 B2 7/2015 Gebeyehu et al.
(Continued)

FOREIGN PATENT DOCUMENTS

KR 10-2022-0094935 7/2022
WO WO 2024/196426 9/2024

OTHER PUBLICATIONS

International Search Report and Written Opinion in application No. PCT/US2023/073228, mailed on Dec. 27, 2023, in 7 pages.
(Continued)

*Primary Examiner* — Henry Choe
(74) *Attorney, Agent, or Firm* — VIA LLP

(57) ABSTRACT

An amplifier circuit comprising: a power amplifier; a bias control circuit coupled to the power amplifier and having a voltage sensor configured to sense a bias voltage to the power amplifier, the bias control circuit being configured to determine whether the bias voltage exceeds a threshold voltage; and a protection circuit coupled to the power amplifier, the bias control circuit being further configured to control the protection circuit to apply a clamping status to limit a power output of the power amplifier to a predetermined value in response to the bias control circuit determining that the bias voltage exceeds a threshold voltage.

18 Claims, 5 Drawing Sheets

(56) References Cited

U.S. PATENT DOCUMENTS

| | | | | |
|---|---|---|---|---|
| 9,817,416 | B2 | 11/2017 | Gebeyehu et al. | |
| 9,882,587 | B2 | 1/2018 | Feng et al. | |
| 10,310,527 | B2 | 6/2019 | Gebeyehu et al. | |
| 10,355,724 | B2 | 7/2019 | Feng et al. | |
| 10,642,296 | B2 | 5/2020 | Gebeyehu et al. | |
| 10,666,200 | B2 | 5/2020 | Gebeyehu et al. | |
| 10,886,953 | B2 | 1/2021 | Feng et al. | |
| 10,958,218 | B2 | 3/2021 | Gebeyehu et al. | |
| 11,349,437 | B2 * | 5/2022 | Hase | H03F 3/211 |
| 11,394,347 | B2 | 7/2022 | Gebeyehu et al. | |
| 11,671,061 | B2 | 6/2023 | Gebeyehu et al. | |
| 11,728,773 | B2 | 8/2023 | Gebeyehu et al. | |
| 2012/0178384 | A1 | 7/2012 | Andrys et al. | |
| 2019/0267948 | A1 | 8/2019 | Su et al. | |
| 2020/0220498 | A1 | 7/2020 | Jia et al. | |
| 2022/0014152 | A1 | 1/2022 | Gebeyehu et al. | |
| 2023/0079623 | A1 | 3/2023 | Gebeyehu | |

OTHER PUBLICATIONS

Adekanle, "Voltage Supervision with a Comparator", Application Brief, Texas Instruments, SNOAAA22, pp. 1-6, Oct. 2023.

International Preliminary Report on Patentability and Written Opinion in application No. PCT/US2023/073228, dated Sep. 20, 2025, in 5 pages.

* cited by examiner

AMPLIFIER CIRCUIT WITH PROTECTION CIRCUIT

INCORPORATION BY REFERENCE TO ANY PRIORITY APPLICATIONS

Any and all applications, if any, for which a foreign or domestic priority claim is identified in the Application Data Sheet of the present application are hereby incorporated by reference under 37 CFR 1.57.

BACKGROUND

Field

Embodiments of the invention relate to an amplifier circuit, and in particular to an amplifier circuit having a protection circuit. Embodiments of the invention also relate to a radio-frequency module, a wireless communication device, and a method for protecting an amplifier circuit.

Description of the Related Technology

Modern power amplifier (PA) modules typically require an overdrive protection loop to clamp average transient power, so that the devices such as temperature compensated surface acoustic wave (TC-SAW) filters and bulk acoustic wave (BAW) filters coupled to the power amplifier modules won't be damaged.

In applications such as cellular devices having one or more power amplifiers, the power generated by the power amplifier needs to be monitored and prevented from exceeding a specified value under any circumstances to ensure device reliability, prevent excessive heat generation, and prolong battery life. This is often provided by a clamping mechanism. Existing arrangements typically implement a clamping status based on an increase in a current being monitored.

Such an existing system is illustrated in FIG. 1, illustrating an amplifier circuit 10. The amplifier circuit comprises a power amplifier 15 configured to amplify an RF input signal $RF_{IN}$ 13 to generate an RF output signal that is provided to, for example, an antenna along an RF signal path. The amplifier circuit 10 includes a controller 11 having a bias control circuit. The controller 11 is situated on a separate die to the power amplifier die 17. The bias control circuit comprises a current sensor configured to sense the collector current of the power amplifier in order to indirectly determine the power of the power amplifier due to the relationship between power and collector current of the power amplifier. By indirectly monitoring the power, the circuit can be clamped when the power exceeds a predetermined threshold in order to protect components in the amplifier circuit 10 or coupled to the power amplifier 15. However, the exact relationship of power to collector current is not accurately known and varies over different operating regions such as VSWR and average power tracking (APT) or envelope tracking (ET) mode. Therefore, such an arrangement does not provide full protection to the components in a module such as a front-end module.

SUMMARY

The invention is defined by the independent claims to which reference should now be made. Optional features are set forth in the dependent claims.

Power generated in a power amplifier and in front-end modules is directly proportional to the supply voltage. The supply voltage is variable due to several normal operation conditions such as during charging and due to a transient spike in the supply voltage of the module. Therefore, the inventor of the present invention has appreciated that not only should a bias current be monitored, but also a bias voltage to the power amplifier of a front-end module. Arrangements described herein solve the aforementioned problem by directly sensing the supply voltage that biases the module and activating a protection circuit to limit or reduce the power generated by the power amplifier when the supply voltage exceeds a predetermined threshold.

Significantly, unlike typical over-voltage protection circuits which are employed to turn off the module completely during an over-voltage condition, solutions described herein limit the power to a predetermined or programmed value. In this way, the device advantageously remains in a functional mode with minimal impact to its performance.

According to one embodiment, there is provided an amplifier circuit comprising: a power amplifier; a bias control circuit coupled to the power amplifier and having a voltage sensor configured to sense a bias voltage to the power amplifier, the bias control circuit being configured to determine whether the bias voltage exceeds a threshold voltage; and a protection circuit coupled to the power amplifier, the bias control circuit being further configured to control the protection circuit to apply a clamping status to limit a power output of the power amplifier to a predetermined value in response to the bias control circuit determining that the bias voltage exceeds a threshold voltage.

In one example, the bias control circuit further comprises a current sensor configured to sense a bias current to the power amplifier, the bias control circuit being further configured to determine whether the bias current exceeds a threshold current and control the protection circuit to apply the clamping status to limit a power output of the power amplifier to the predetermined value in response to the bias control circuit determining that the bias current exceeds a threshold current.

In one example, in order to limit the power output of the power amplifier to the predetermined value, the protection circuit is configured to limit the bias current to a current clamp threshold during the clamping status.

In one example, the bias control circuit is configured to generate a reference voltage at the threshold voltage, and the bias control circuit is configured to determine whether the bias voltage exceeds the threshold voltage by comparing the bias voltage with the reference voltage.

In one example, the bias control circuit is configured to generate a reference current at the threshold current, and the bias control circuit is configured to determine whether the bias current exceeds the threshold current by comparing the bias current with the reference current.

In one example, the current clamp threshold is determined based on power requirements of power amplifier.

In one example, the current clamp threshold is configured to be adjusted based on a ruggedness of one or more components of, or coupled to, the amplifier circuit.

In one example, the threshold voltage is determined based on the ruggedness of one or more components of, or coupled to, the amplifier circuit.

In one example, the bias control circuit is further configured to control the threshold voltage to account for process, temperature, and/or voltage variation.

According to one embodiment, there is provided a radio frequency module comprising: an amplifier circuit having: a power amplifier configured to provide a radio frequency signal; a bias control circuit coupled to the power amplifier and having a voltage sensor configured to sense a bias voltage to the power amplifier, the bias control circuit being configured to determine whether the bias voltage exceeds a threshold voltage; and a protection circuit coupled to the power amplifier, the bias control circuit being further configured to control the protection circuit to apply a clamping status to limit a power output of the power amplifier to a predetermined value in response to the bias control circuit determining that the bias voltage exceeds a threshold voltage, and a filter configured to filter the radio frequency signal.

According to one embodiment, there is provided a wireless communication device comprising an amplifier circuit having: a power amplifier configured to provide a radio frequency signal; a bias control circuit coupled to the power amplifier and having a voltage sensor configured to sense a bias voltage to the power amplifier, the bias control circuit being configured to determine whether the bias voltage exceeds a threshold voltage; and a protection circuit coupled to the power amplifier, the bias control circuit being further configured to control the protection circuit to apply a clamping status to limit a power output of the power amplifier to a predetermined value in response to the bias control circuit determining that the bias voltage exceeds a threshold voltage.

According to one embodiment, there is provided a method of protecting an amplifier circuit, the method comprising: sensing, by a voltage sensor of a bias control circuit, a bias voltage to a power amplifier; determining whether the bias voltage exceeds a threshold voltage; and if the bias voltage exceeds the threshold voltage, controlling a protection circuit coupled to the power amplifier to apply a clamping status to limit a power output of the power amplifier to a predetermined value in response to the determining that the bias voltage exceeds the threshold voltage.

In one embodiment, the method further comprises: sensing, by a current sensor of the bias control circuit, a bias current to the power amplifier; determining whether the bias current exceeds a threshold current; and if the bias current exceeds the threshold current, controlling the protection circuit to apply the clamping status to limit the power output of the power amplifier to the predetermined value in response to determining that the bias current exceeds the threshold current.

In one embodiment, applying the clamping status to limit the power output of the power amplifier to the predetermined value comprises limiting the bias current to a current clamp threshold during the clamping status.

In one embodiment, the method further comprises: generating a reference voltage at the threshold voltage; and determining whether the bias voltage exceeds the threshold voltage by comparing the bias voltage with the reference voltage.

In one embodiment, the method further comprises: generating a reference current at the threshold current; and determining whether the bias current exceeds the threshold current by comparing the bias current with the reference current.

In one embodiment, the method further comprises determining the current clamp threshold based on power requirements of the power amplifier.

In one embodiment, the method further comprises adjusting the current clamp threshold based on a ruggedness of one or more components of, or coupled to, the amplifier circuit.

In one embodiment, the method further comprises determining the threshold voltage based on the ruggedness of one or more components of, or coupled to, the amplifier circuit.

In one embodiment, the method comprises controlling the threshold voltage to account for process, temperature, and/or voltage variation.

Arrangements of the present disclosure provide for accurate monitoring and measuring of the power level, as well as acting on a power level exceeding a threshold as fast as possible to limit the power level of the front-end module so it doesn't exceed the power handling capability of the components that makes up transmit modules. This may be a requirement that should be met for all practical environmental and operating conditions. The protection system described herein also advantageously ensures that the different components in the module such as the front-end module do not see power exceeding their maximum power handling limit while simultaneously not limiting or degrading other performance metrics such as Adjacent Channel Power Ratio in a 50 ohm resistance and acceptable Voltage Standing Wave Ratio (VSWR) conditions such as VSWR3:1 by engaging in normal operation condition. Thus, both bias current and supply voltage is tracked to enable a robust protection scheme over all operating conditions including VSWR conditions.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Figure 1:
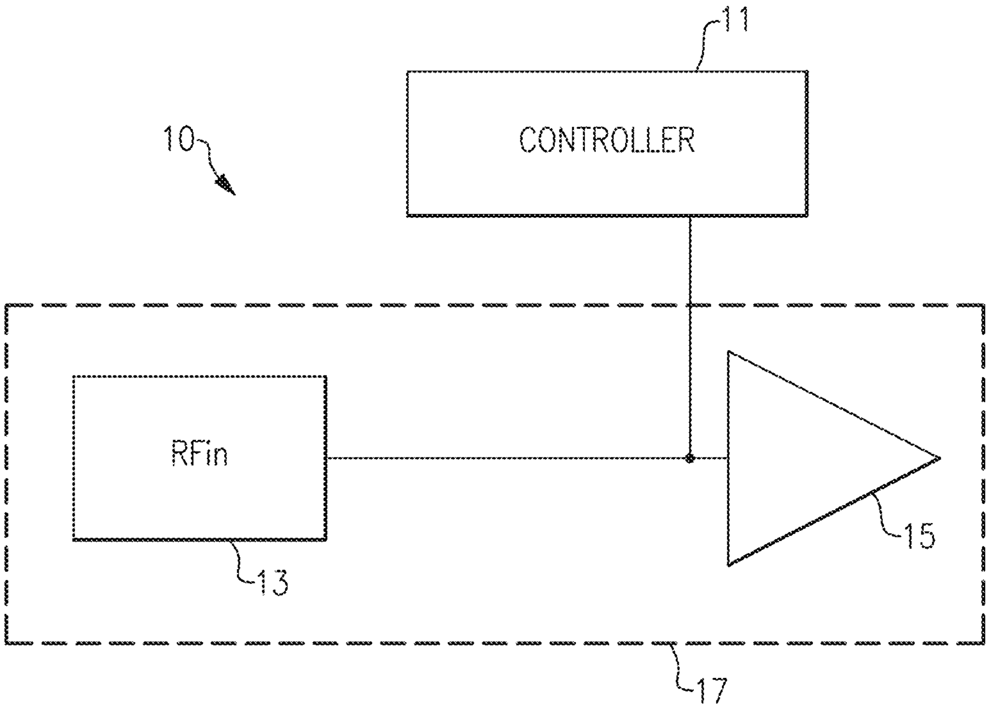
FIG.1 Prior Art
FIG. 1 is a schematic diagram illustrating an amplifier circuit according to the prior art.

Aspects and embodiments described herein are directed to an amplifier circuit having an overdrive protection circuit, A radio frequency (RF) communication device can include multiple antennas for supporting wireless communications. Additionally, the RF communication device can include a radio frequency front-end (RFFE) system for processing signals received from and transmitted by the antennas. The RFFE system can provide a number of functions, including, but not limited to, signal filtering, signal partitioning and combining, controlling component connectivity to the antennas, and/or signal amplification. Additionally, the RFFE system includes power amplifiers for amplifying RF signals for transmission on the antennas.

RFFE systems can be used to handle RF signals of a wide variety of types, including, but not limited to, wireless local area network (WLAN) signals, Bluetooth signals, and/or cellular signals. RFFE systems are also referred to herein as front-end systems.

RFFE systems can be used to process signals of a wide range of frequencies. For example, certain RFFE systems can operate using one or more low bands (for example, RF signal bands having a frequency content of 1 GHz or less, also referred to herein as LB), one or more mid bands (for example, RF signal bands having a frequency content between 1 GHz and 2.3 GHz, also referred to herein as MB), one or more high bands (for example, RF signal bands having a frequency content between 2.3 GHz and 3 GHz, also referred to herein as HB), and one or more ultrahigh bands (for example, RF signal bands having a frequency content between 3 GHz and 7.125 GHz, also referred to herein as UHB). In certain implementations, modules operate over mid band and high band frequencies (MHB).

RFFE systems can be used in a wide variety of RF communication devices, including, but not limited to, smartphones, base stations, laptops, handsets, wearable electronics, and/or tablets.

An RFFE system can be implemented to support a variety of features that enhance bandwidth and/or other performance characteristics of the RF communication device in which the RFFE system is incorporated.

For example, to support wider bandwidth, an increasing number of uplink carrier aggregation scenarios have been developed to support wider bandwidth. Additionally, the bandwidths for uplink and downlink cannot be arbitrarily sent since there is a minimum uplink bandwidth for maintaining a reliable link supported by the transport layer's ACK/NACK traffic. Thus, in 4G/5G, wideband uplink carrier aggregation should be supported to achieve higher bandwidth for downlink carrier aggregation.

Thus, an RFFE system can be implemented to support both uplink and downlink carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels, for instance up to five carriers. Carrier aggregation includes contiguous aggregation, in which contiguous carriers within the same operating frequency band are aggregated. Carrier aggregation can also be non-contiguous, and can include carriers separated in frequency within a common band or in different bands.

Transition from 4G to 5G is through non-standalone (NSA) operation, rather than directly to full standalone (SA) operation. Current networks operate in 4G and 5G concurrently by communicating with an eNodeB and a gNodeB simultaneously in an EN-DC mode of operation. Thus, 4G and 5G transmitters operate concurrently in such a phone.

To provide such feature support, an RFFE system can be implemented to support EN-DC. Support for EN-DC can cover a wide range of frequency bands, including using a 4G band in the LB, MHB, HB, or UHB frequency ranges in combination with a 5G band in the LB, MHB, HB, or UHB frequency ranges. Thus, various combinations of EN-DC including, but not limited to, LB-LB EN-DC, MHB-MHB EN-DC, LB-MHB EN-DC, LB-UHB EN-DC, MHB-UHB EN-DC, and UHB-UHB EN-DC, are possible.

Moreover, in certain dual uplink transmission scenarios, it can be desirable to provide flexibility between swapping which antenna transmits a first RF transmit signal (for instance, one of a 4G signal or a 5G signal) on a first side of a phone board assembly and which antenna transmits a second RF transmit signal (for instance, the other of the 4G signal or the 5G signal) on a side of the phone board assembly. To provide such flexibility, an RFFE system can support a transmit swap function to selectively switch which antenna a particular RF transmit signal is transmitted from.

Another technique for increasing uplink capacity is uplink multiple-input multiple-output (MIMO) communications, in which multiple (for instance, two) power amplifiers transmit two different signals simultaneously on the same frequency using different antennas. MIMO communications benefit from higher signal to noise ratio, improved coding, and/or reduced signal interference due to spatial multiplexing differences of the radio environment. MIMO order refers to a number of separate data streams sent or received.

RFFE systems include power amplifiers for amplifying RF transmit signals used in these as well as other applications.

Power amplifiers can receive large RF input signals under certain conditions. For example, a power amplifier can be driven with a large RF input signal in the presence of variation in voltage standing wave ratio (VSWR) and/or temperature.

Although a power amplifier and a downstream filter (for instance, an acoustic wave filter) can be implemented for handling VSWR and temperature variation under normal signaling conditions (for instance, transmitting at a maximum MPRO power), the power amplifier and/or downstream filter can be damaged under an excess RF input signal drive event. For example, a downstream bulk acoustic wave (BAW) or surface acoustic wave (SAW) filter may be damaged at a certain threshold over MPRO power (for instance, 3.5 dB higher than maximum rated MPRO power).

Thus, in applications such as cellular, the power generated by a power amplifier should be monitored and clamped not to exceed a specified value to ensure device reliability, to prevent excessive heat generation, and/or to prolong battery life. Accurately monitoring, measuring, and acting on high signal power as fast as possible is desirable to limit the power level within the RFFE system. Such performance should be for all practical environmental and operating conditions, while simultaneously not degrading other performance metrics such as adjacent channel power ratio.

Apparatus and methods for clamping of a power amplifier using a protection circuit are provided. In certain embodiments, an amplifier circuit comprises: a power amplifier; a bias control circuit coupled to the power amplifier and having a voltage sensor configured to sense a bias voltage to the power amplifier, the bias control circuit being configured to determine whether the bias voltage exceeds a threshold voltage; and a protection circuit coupled to the power amplifier, the bias control circuit being further configured to control the protection circuit to apply a clamping status to limit a power output of the power amplifier to a predetermined value in response to the bias control circuit determining that the bias voltage exceeds a threshold voltage.

By implementing the amplifier circuit in this manner, components are protected from high voltages causing high power output from the power amplifier. In addition, by implementing the amplifier circuit as described herein, improved ruggedness is achieved without incurring degradation in power, efficiency, and/or gain at nominal conditions. Furthermore, downstream or post-power amplifier circuitry such as acoustic wave filters are protected. Moreover, bias control circuit and protection or clamping circuit avoids loading the RF signal input of the power amplifier, and thus provides little to no parasitic loading and corresponding performance degradation at nominal conditions.

Figure 2:
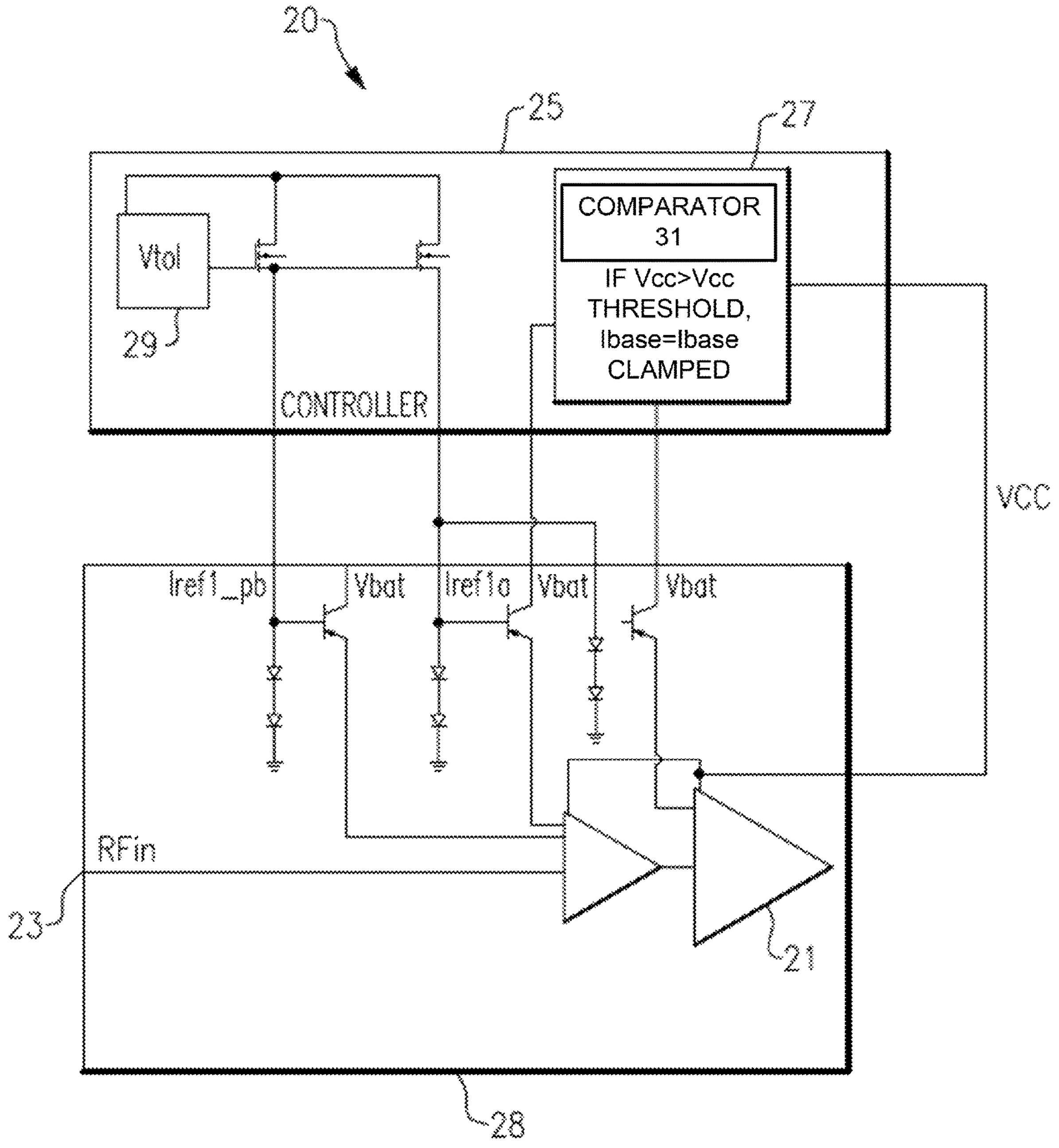
FIG. 2 is a schematic diagram illustrating an amplifier circuit according to aspects of the present invention.

FIG. 2 illustrates an amplifier circuit 20 arranged to provide protection to components, for example, in a front-end module. The amplifier circuit 20 comprises a power amplifier 21 for amplifying an RF input signal $RF_{IN}$ 23 to generate an RF output signal. In this example, the power amplifier 21 is a multi-stage power amplifier. The amplified radio frequency signal 23 may then be provided to subsequent components such as an antenna or filter along an RF signal path. In order to protect components of the front-end module, the power output of the power amplifier 21 must be monitored. The power output of the power amplifier 21 may experience an increase due to increasing current or increasing voltage which can adversely affect components.

Therefore, the amplifier circuit 20 according to embodiments of the present disclosure comprises a controller 25 having a bias controller circuit. The bias control circuit comprises means for monitoring and reacting to a current biasing the power amplifier 21, and significantly, a supply voltage $V_{cc}$ biasing the power amplifier 21.

In order to monitor the current biasing the power amplifier 21 and in particular at the base of the last stage of the multi-stage power amplifier 21, the controller generates a reference current at a current threshold. The current biasing the last stage of the power amplifier 21 is compared with the reference current generated by the bias control circuit of the controller 25. If the bias current exceeds the reference current when compared, it is determined that the current is too high and may cause the power of the power amplifier 21 to increase to such an extent that components may be damaged. In order to protect from such a power increase, the amplifier circuit 20 comprises a protection circuit. In response to determining that the bias current is above the threshold current, the bias control circuit provides protection to the amplifier circuit and subsequent components by activating a protection circuit configured to clamp the current biasing the power amplifier.

In addition, significantly, the bias control circuit comprises a voltage sensor 27 to continuously sense the supply voltage $V_{cc}$ of the module with a voltage sensor. It will be appreciated that any suitable voltage sensor may be used, such as a capacitive or resistive voltage sensor. The controller also comprises a voltage to current converter 29. The bias voltage $V_{cc}$ to the power amplifier 21 is monitored by generating a reference voltage at a threshold supply voltage $V_{cc}$_threshold and comparing, via the comparator 31, the reference voltage $V_{cc}$_threshold with the bias voltage $V_{cc}$. When the voltage sensor 27 senses that the threshold supply voltage $V_{cc}$_threshold has been exceeded, the bias control circuit controls the protection circuit to limit the bias current (and therefore the power) to a predetermined target current as set by the clamp threshold. For example, the supply based protection circuit current threshold may be set to the last stage base current to the power amplifier 21 needed to achieve rated power or maximum power in a 50 ohm resistance arising from a component coupled to the power amplifier 21 such as an antenna. That is, in typical operation, an antenna may be configured to provide a resistance to the output of the power amplifier of 50 ohm. However, the situation may occur in which the antenna provides a much lower resistance such as 0 ohm resulting in a short circuit in the extreme case. Components must therefore be protected. Therefore, in this example, whenever the voltage supply exceeds the threshold supply voltage $V_{cc}$_threshold, the output stage power amplifier base current is limited to 50 ohm $P_{rated}$ or $P_{max}$. It will be appreciated, however, that the clamp threshold current may be set to be any appropriate current.

Thus, the power amplifier 21 is instructed to reduce its gain when the supply voltage $V_{cc}$ exceeds the threshold voltage $V_{cc}$_threshold, which ensures that power does not scale up with $V_{cc}$ exceeding the threshold voltage as ruggedness is run at much higher $V_{cc}$ than the component is designed to operate at. Programmability and a process, voltage, and temperature (PVT) correction scheme may be added to the controller and in particular the threshold voltage and current generators to maintain an accurate power sensing and power limiting action over PVT.

In certain implementations, the threshold of the power detector is programmable to adapt to variation, for instance, using a bias controller implemented with programmability to account for process, voltage, and/or temperature (PVT) variation, frequency band, and/or communication mode (for instance, 4G or 5G). The threshold programming can be specific to a particular deployment scenario of the power amplifier, for instance, whether a SAW or a BAW filter is downstream to account for a suitable limit to peak power and/or average power.

The controller 25 and control circuitry may be located on a different die (such as a complementary metal-oxide semiconductor (CMOS)) to the power amplifier 21 circuitry die 28.

In use, a current clamp target is initially defined. That is, a current that will be provided during the clamping condition of the protection circuit. In this example, the current clamp target is set as the last stage power amplifier base current at $P_{rated}$ or $P_{max}$ at 50 ohm resistance or lower.

In addition, a threshold current and a threshold supply voltage $V_{cc}$_threshold are defined. These may be based on the characteristics of the components in the front-end module. During operation, when the bias current and supply voltage $V_{cc}$ are below their respective current and voltage thresholds, the standard abnormal over current protection (AOCP)/current clamp (CC) threshold is activated. However, when one or both of operation bias current or supply voltage $V_{cc}$ exceeds their respective thresholds, the protection circuit including the $V_{cc}$ based current clamp is activated. The voltage threshold $V_{cc}$_threshold may be a $V_{cc}$ value higher than a normal operating $V_{cc}$ by, for example, 100 mV. This may be, for example, $V_{cc}$_LUT+0.5V, where $V_{cc}$_LUT is a voltage value derived from a lookup table for respective components in the front-end module, providing voltages required to generate a particular power. Voltage values higher than these values result in power output typically damaging to components.

The current provided during the clamping condition Ibase_clamp is set, in this example, to be no more than a base current Ibase that generates a maximum power $P_{max}$.

Advantageously, the current provided during the clamping condition and the $V_{cc}$_threshold may be adjusted/optimized based on ruggedness data of, for example, the components in the front-end module or the power amplifier circuit.

Figure 3:
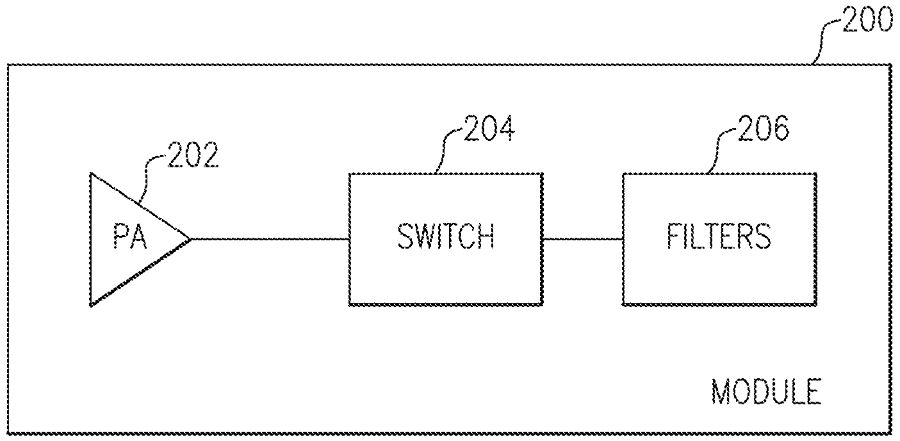
FIG. 3 is a schematic block diagram of a module that includes a power amplifier circuit according to aspects of the present invention, a switch, and filters.

FIG. 3 is a schematic block diagram of a module 200 such as a radio frequency module that includes a power amplifier 202 including the amplifier circuit 20 in accordance with one or more embodiments described herein, a switch 204, and filters 206. The amplifier circuit 20 according to one or more embodiments described herein and having one or more associated advantages as described herein provides protection to the switch 204 and filters 206, whilst simultaneously not limiting or degrading other performance metrics during clamping of the protection circuit in the amplifier circuit 20. The module 200 can include a package that encloses the illustrated elements. The power amplifier 202, the switch 204, and the filters 206 can be disposed on a common packaging substrate. The packaging substrate can be a laminate substrate, for example. The power amplifier 202 can amplify a radio frequency signal. The power amplifier 202 can include a gallium arsenide bipolar transistor in certain applications. The switch 204 can be a multi-throw radio frequency switch. The switch 204 can electrically couple an output of the power amplifier 202 to a selected filter of the filters 206. The filters 206 can include any suitable number of surface acoustic wave filters and/or other acoustic wave filters. One or more of the surface acoustic wave filters of the filters 206 can be implemented in accordance with any suitable principles.

Figure 4:
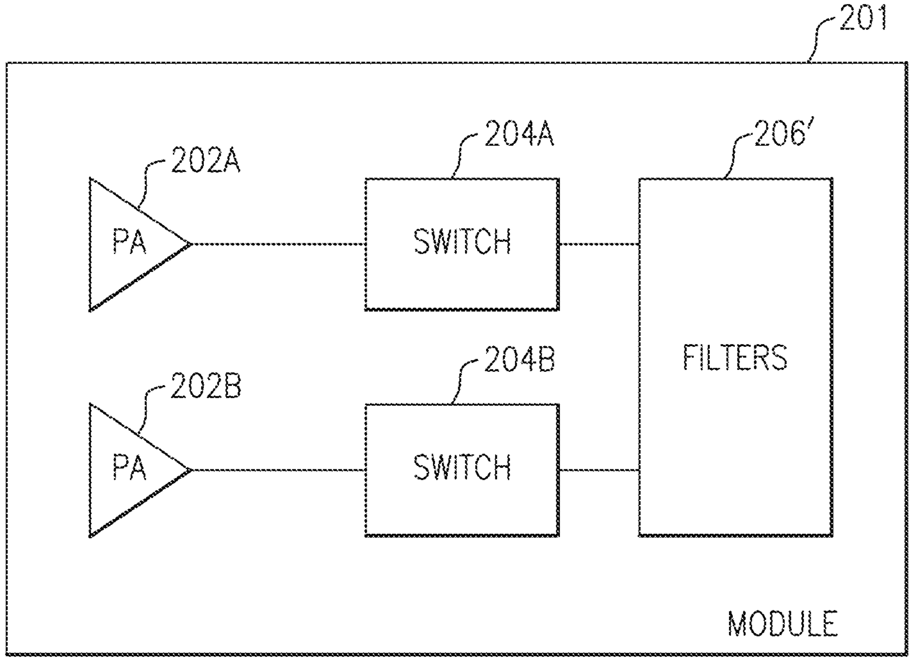
FIG. 4 is a schematic block diagram of a module that includes power amplifier circuits according to aspects of the present invention, switches, and filters.

FIG. 4 is a schematic block diagram of a module 201 such as a radio frequency module that includes power amplifiers 202A and 202B, one or both of the power amplifiers including an amplifier circuit in accordance with one or more embodiments described herein, switches 204A and 204B, and filters 206'. The module 201 is like the module 200 of FIG. 3, except that the module 201 includes an additional power amplifier 202B and an additional switch 204B and the filters 206' are arranged to filter signals for the signals paths associated with a plurality of power amplifiers 202A and 202B. The different signal paths can be associated with different frequency bands and/or different modes of operation (e.g. different power modes, different signaling modes, etc.).

Figure 5:
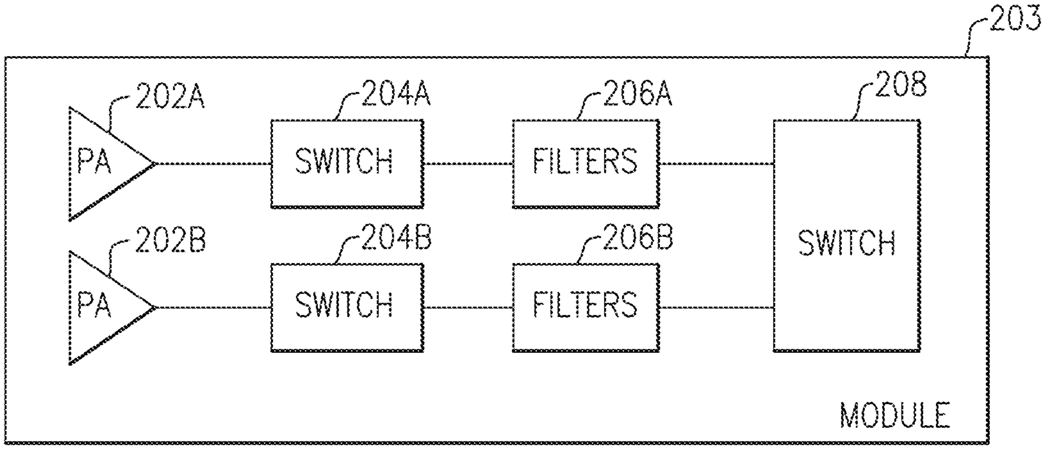
FIG. 5 is a schematic block diagram of a module that includes power amplifiers according to aspects of the present invention, switches, and filters.

FIG. 5 is a schematic block diagram of a module 203 such as a radio frequency module that includes power amplifiers 202A and 202B, one or both of the power amplifiers including an amplifier circuit in accordance with one or more embodiments described herein, more switches 204A and 204B, filters 206A and 206B, and an antenna switch 208. The module 203 is like the module 201 of FIG. 3, except the module 203 includes an antenna switch 208 arranged to selectively couple a signal from the filters 206A or the filters 206B to an antenna node. The filters 206A and 206B can correspond to the filters 206' of FIG. 3.

Figure 6:
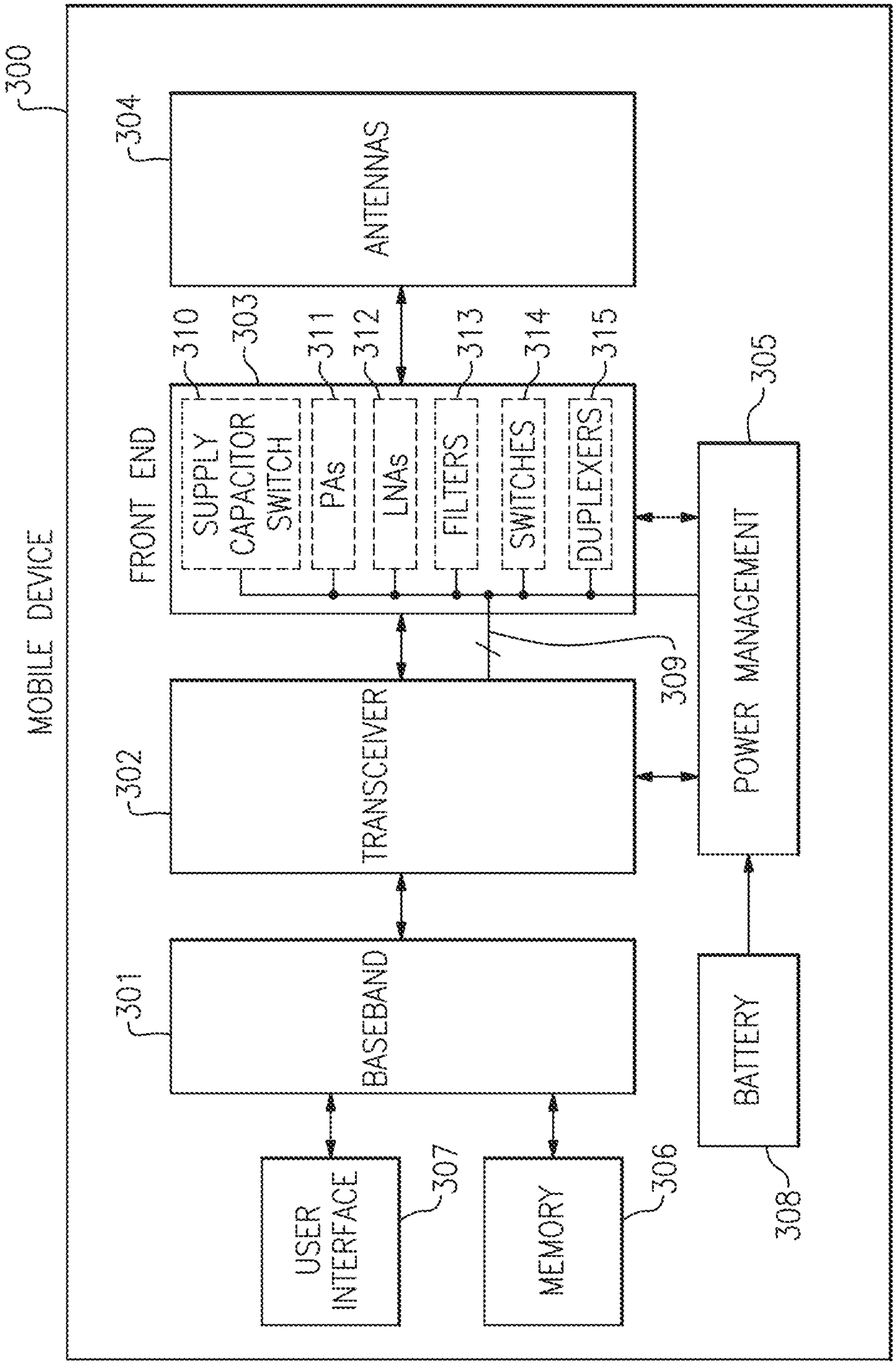
FIG. 6 is a schematic diagram of one embodiment of a wireless communication device.

FIG. 6 is a schematic diagram of one embodiment of a wireless communication device such as a mobile device 300. The mobile device 300 includes a baseband system 301, a transceiver 302, a front end system 303, antennas 304, a power management system 305, a memory 306, a user interface 307, and a battery 308.

Although the mobile device 300 illustrates one example of a radio frequency (RF) system that can include one or more features of the present disclosure, the teachings herein are applicable to electronic systems implemented in a wide variety of ways.

The mobile device 300 can be used to communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and ZigBee), WMAN (for instance, WiMax), and/or GPS technologies.

The transceiver 302 generates RF signals for transmission and processes incoming RF signals received from the antennas 304. It will be understood that various functionalities associated with the transmission and receiving of RF signals can be achieved by one or more components that are collectively represented in FIG. 6 as the transceiver 302. In one example, separate components (for instance, separate circuits or dies) can be provided for handling certain types of RF signals.

As shown in in FIG. 6, the transceiver 302 is connected to the front end system 303 and to the power management circuit 305 using a serial interface 309. All or part of the illustrated RF components can be controlled by the serial interface 309 to configure the mobile device 300 during initialization and/or while fully operational. In another embodiment, the baseband processor 301 is additionally or alternative connected to the serial interface 309 and operates to configure one or more RF components, such as components of the front end system 303 and/or power management system 305.

The front end system 303 aids in conditioning signals transmitted to and/or received from the antennas 304. In the illustrated embodiment, the front end system 303 includes one or more bias control circuits 310 for controlling power amplifier biasing, one or more power amplifiers (PAs) 311 including one or more amplifier circuits in accordance with one or more embodiments described herein, one or more low noise amplifiers (LNAs) 312, one or more filters 313, one or more switches 314, and one or more duplexers 315. However, other implementations are possible.

For example, the front end system 303 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 300 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 304 can include antennas used for a wide variety of types of communications. For example, the antennas 304 can include antennas for transmitting and/or receiving signals associated with a wide variety of frequencies and communications standards.

In certain implementations, the antennas 304 support multiple-input and multiple-output (MIMO) communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 300 can operate with beamforming in certain implementations. For example, the front end system 303 can include phase shifters having variable phase controlled by the transceiver 302. Additionally, the phase shifters are controlled to provide beam formation and directivity for transmission and/or reception of signals using the antennas 304. For example, in the context of signal transmission, the phases of the transmit signals provided to the antennas 304 are controlled such that radiated signals from the antennas 304 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 304 from a particular direction. In certain implementations, the antennas 304 include one or more arrays of antenna elements to enhance beamforming.

The baseband system 301 is coupled to the user interface 307 to facilitate processing of various user input and output (I/O), such as voice and data. The baseband system 301 provides the transceiver 302 with digital representations of transmit signals, which the transceiver 302 processes to generate RF signals for transmission. The baseband system 301 also processes digital representations of received signals provided by the transceiver 302. As shown in FIG. 6, the baseband system 301 is coupled to the memory 306 to facilitate operation of the mobile device 300.

The memory 306 can be used for a wide variety of purposes, such as storing data and/or instructions to facilitate the operation of the mobile device 300 and/or to provide storage of user information.

The power management system 305 provides a number of power management functions of the mobile device 300. In certain implementations, the power management system 305 includes a power amplifier (PA) supply control circuit that controls the supply voltages of the power amplifiers 311. For example, the power management system 305 can be configured to change the supply voltage(s) provided to one or more of the power amplifiers 311 to improve efficiency, such as power added efficiency (PAE). The supply voltage provided to the power amplifiers 311 is monitored or sensed in accordance with embodiments described herein in order to activate the protection circuit when a supply voltage threshold is exceeded.

The power management system 305 can operate in a selectable supply control mode, such an average power tracking (APT) mode or an envelope tracking (ET) mode. In the illustrated embodiment, the selected supply control mode of the power management system 305 is controlled by the transceiver 302. In certain implementations, the transceiver 302 controls the selected supply control mode using the serial interface 309.

As shown in FIG. 6, the power management system 305 receives a battery voltage from the battery 308. The battery 308 can be any suitable battery for use in the mobile device 300, including, for example, a lithium-ion battery. Although the power management system 305 is illustrated as separate from the front end system 303, in certain implementations all or part (for instance, a PA supply control circuit) of the power management system 305 is integrated into the front end system 303.

Aspects of this disclosure can be implemented in various electronic devices. Examples of the electronic devices can include, but are not limited to, consumer electronic products, parts of the consumer electronic products such as semiconductor die and/or packaged radio frequency modules, electronic test equipment, uplink wireless communication devices, personal area network communication devices, etc. Examples of the consumer electronic products can include, but are not limited to, a mobile phone such as a smart phone, a wearable computing device such as a smart watch or an ear piece, a telephone, a television, a computer monitor, a computer, a router, a modem, a hand-held computer, a laptop computer, a tablet computer, a personal digital assistant (PDA), a microwave, a refrigerator, a vehicular electronics system such as an automotive electronics system, a stereo system, a DVD player, a CD player, a digital music player such as an MP3 player, a radio, a camcorder, a camera such as a digital camera, a portable memory chip, a washer, a dryer, a washer/dryer, peripheral device, a clock, etc. Further, the electronic devices can include unfinished products.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

What is claimed is:

1. An amplifier circuit comprising:

a power amplifier;

a bias control circuit coupled to the power amplifier and having a voltage sensor configured to sense a bias voltage to the power amplifier, the bias control circuit being configured to determine whether the bias voltage exceeds a threshold voltage, the bias control circuit further configured to generate a reference voltage at the threshold voltage, and to determine whether the bias voltage exceeds the threshold voltage by comparing the bias voltage with the reference voltage; and a protection circuit coupled to the power amplifier, the bias control circuit being further configured to control the protection circuit to apply a clamping status to limit a power output of the power amplifier to a predetermined value in response to the bias control circuit determining that the bias voltage exceeds a threshold voltage.

2. The amplifier circuit of claim 1 wherein the bias control circuit further comprises a current sensor configured to sense a bias current to the power amplifier, the bias control circuit being further configured to determine whether the bias current exceeds a threshold current and control the protection circuit to apply the clamping status to limit a power output of the power amplifier to the predetermined value in response to the bias control circuit determining that the bias current exceeds a threshold current.

3. The amplifier circuit of claim 2 wherein in order to limit the power output of the power amplifier to the predetermined value, the protection circuit is configured to limit the bias current to a current clamp threshold during the clamping status.

4. The amplifier circuit of claim 2 wherein the bias control circuit is configured to generate a reference current at the threshold current, and the bias control circuit is configured to determine whether the bias current exceeds the threshold current by comparing the bias current with the reference current.

5. The amplifier circuit of claim 3 wherein the current clamp threshold is determined based on power requirements of power amplifier.

6. The amplifier circuit of claim 3 wherein the current clamp threshold is configured to be adjusted based on a ruggedness of one or more components of, or coupled to, the amplifier circuit.

7. The amplifier circuit of claim 1 wherein the threshold voltage is determined based on ruggedness of one or more components of, or coupled to, the amplifier circuit.

8. The amplifier circuit of claim 1 wherein the bias control circuit is further configured to control the threshold voltage to account for process, temperature, and/or voltage variation.

9. A radio frequency module comprising:

an amplifier circuit having a power amplifier that provides a radio frequency signal, a bias control circuit coupled to the power amplifier and having a voltage sensor configured to sense a bias voltage to the power amplifier, the bias control circuit being configured to determine whether the bias voltage exceeds a threshold voltage, the bias control circuit further configured to generate a reference voltage at the threshold voltage, and to determine whether the bias voltage exceeds the threshold voltage by comparing the bias voltage with the reference voltage;

a protection circuit coupled to the power amplifier, the bias control circuit being further configured to control the protection circuit to apply a clamping status to limit a power output of the power amplifier to a predetermined value in response to the bias control circuit determining that the bias voltage exceeds a threshold voltage; and a filter configured to filter the radio frequency signal.

10. A wireless communication device comprising an amplifier circuit having:

a power amplifier that provides a radio frequency signal;

a bias control circuit coupled to the power amplifier and having a voltage sensor configured to sense a bias voltage to the power amplifier, the bias control circuit determines whether the bias voltage exceeds a threshold voltage, the bias control circuit further configured to generate a reference voltage at the threshold voltage, and to determine whether the bias voltage exceeds the threshold voltage by comparing the bias voltage with the reference voltage; and a protection circuit coupled to the power amplifier, the bias control circuit being further configured to control the protection circuit to apply a clamping status to limit a power output of the power amplifier to a predetermined value in response to the bias control circuit determining that the bias voltage exceeds a threshold voltage.

11. A method of protecting an amplifier circuit, the method comprising:

sensing, by a voltage sensor of a bias control circuit, a bias voltage to a power amplifier;

determining whether the bias voltage exceeds a threshold voltage;

in response to the bias voltage exceeding the threshold voltage, controlling a protection circuit coupled to the power amplifier to apply a clamping status to limit a power output of the power amplifier to a predetermined value in response to the determining that the bias voltage exceeds the threshold voltage;

sensing, by a current sensor of the bias control circuit, a bias current to the power amplifier;

determining whether a bias current exceeds a threshold current; and in response to the bias current exceeding the threshold current, controlling the protection circuit to apply the clamping status to limit the power output of the power amplifier to the predetermined value in response to determining that the bias current exceeds the threshold current.

12. The method of claim 11 wherein applying the clamping status to limit the power output of the power amplifier to the predetermined value comprises limiting the bias current to a current clamp threshold during the clamping status.

13. The method of claim 11 further comprising generating a reference voltage at the threshold voltage; and determining whether the bias voltage exceeds the threshold voltage by comparing the bias voltage with the reference voltage.

14. The method of claim 11 further comprising:

generating a reference current at the threshold current; and determining whether the bias current exceeds the threshold current by comparing the bias current with the reference current.

15. The method of claim 12 further comprising determining the current clamp threshold based on power requirements of the power amplifier.

16. The method of claim 12 further comprising adjusting the current clamp threshold based on a ruggedness of one or more components of, or coupled to, the amplifier circuit.

17. The method of claim 11 further comprising determining the threshold voltage based on ruggedness of one or more components of, or coupled to, the amplifier circuit.

18. The method of claim 11 further comprising controlling the threshold voltage to account for process, temperature, and/or voltage variation.

* * * * *